United States Patent [19]

Miyaji et al.

[11] Patent Number: 5,046,052

[45] Date of Patent: Sep. 3, 1991

[54] INTERNAL LOW VOLTAGE TRANSFORMATION CIRCUIT OF STATIC RANDOM ACCESS MEMORY

[75] Inventors: Fumio Miyaji; Yukio Aoki, both of Kanagawa, Japan

[73] Assignee: Sony Corporation, Tokyo, Japan

[21] Appl. No.: 359,153

[22] Filed: May 31, 1989

[30] Foreign Application Priority Data

Jun. 1, 1988 [JP] Japan .................. 63-135101
Jul. 29, 1988 [JP] Japan .................. 63-191547

[51] Int. Cl.$^5$ .................. G11C 8/00; G11C 11/41
[52] U.S. Cl. .................. 365/226; 365/189.02; 365/227; 365/228; 365/229; 365/230.06
[58] Field of Search .............. 365/227, 228, 229, 226, 365/230.06, 189.09

[56] References Cited

U.S. PATENT DOCUMENTS

| | | | |
|---|---|---|---|
| 4,156,940 | 5/1979 | Hollingsworth et al. | 365/189.09 |
| 4,321,489 | 3/1982 | Higuchi et al. | 365/226 |
| 4,585,955 | 8/1986 | Uchida | 365/226 |
| 4,631,707 | 12/1986 | Watanabe | 365/226 |
| 4,699,252 | 9/1987 | Furuyama et al. | 365/189.09 |
| 4,709,354 | 11/1987 | Ichinose et al. | 365/226 |
| 4,730,279 | 3/1988 | Ohtani | 365/203 |
| 4,740,818 | 4/1988 | Okajima et al. | 365/226 |
| 4,751,683 | 6/1988 | Wada et al. | 365/226 |
| 4,901,284 | 2/1990 | Ochii et al. | 365/226 |
| 4,930,112 | 5/1990 | Tanaka et al. | 365/226 |
| 4,937,789 | 6/1990 | Matsubara | 365/226 |

FOREIGN PATENT DOCUMENTS

| | | |
|---|---|---|
| 1040917 | 12/1981 | European Pat. Off. . |
| 146356 | 6/1985 | European Pat. Off. . |
| 166540 | 1/1986 | European Pat. Off. . |
| 104290 | 5/1988 | Japan . |

Primary Examiner—Stuart N. Hecker
Assistant Examiner—Michael A. Whitfield
Attorney, Agent, or Firm—Alvin Sinderbrand; William S. Frommer

[57] ABSTRACT

In a static RAM having an internal low voltage transformation circuit, a word line drive circuit is provided which applies a low voltage, from an internal low voltage transformation circuit to a word line during readout to improve the static RAM operating margin. The internal low voltage transformation circuit is formed by a reference voltage supply circuit and an internal voltage control circuit. A data hold voltage is supplied, when the static RAM is operating at a lower voltage, by a power pull-down device having a lower power consumption than the internal low voltage transformation circuit so as to achieve power consumption savings.

4 Claims, 5 Drawing Sheets

INTERNAL LOW VOLTAGE TRANSFORMATION CIRCUIT OF STATIC RANDOM ACCESS MEMORY

FIELD OF THE INVENTION

This invention relates in general to a static RAM and more particularly to a static RAM having an internal low-voltage transformation circuit for producing a predetermined low voltage from local on-chip power source.

DESCRIPTION OF THE PRIOR ART

Figure 3:
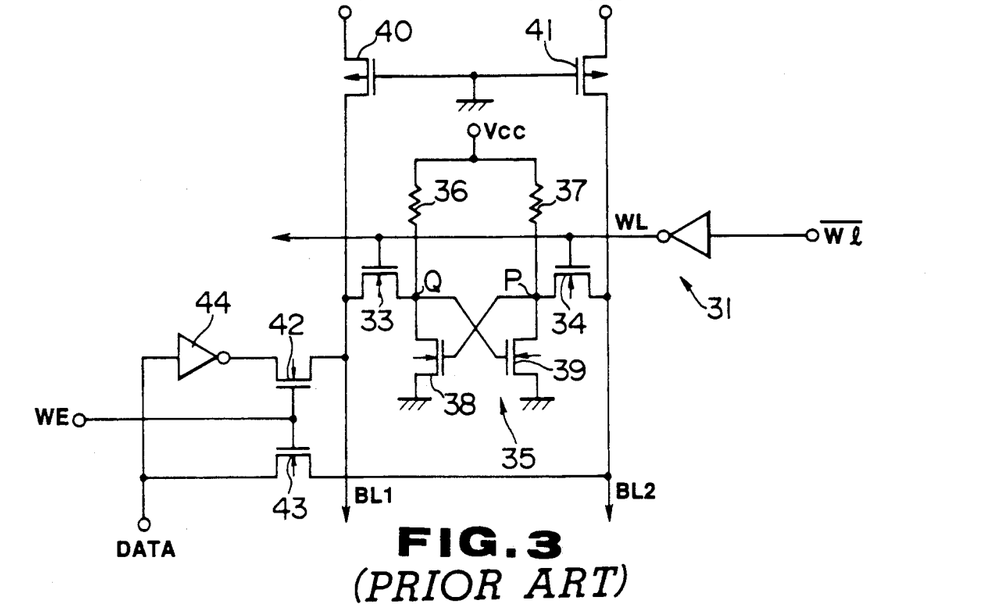
FIG. 3 is a circuit diagram showing an example of a conventional static RAM.

A static RAM of the prior art will now be described with reference to FIG. 3. The static RAM includes a word line drive circuit 31 having an inverter circuit, a pair of bit lines BL1 and BL2 having terminal load transistors 40 and 41, a memory cell 35 having word transistors 33 and 34 connected to the bit lines BL1 and BL2 and data write transistors 42 and 43.

The memory cell 35 comprises resistor elements 36 and 37 and drive transistors 38 and 39, along with the above-mentioned word transistors 33 and 34. A power supply voltage, Vcc, or 5 volts is applied to one end of each of the resistor elements 36 and 37. The gates of the word transistors 33 and 34 are connected to a word line WL and selected by the word line drive circuit 31. The source and drain electrodes of the word transistors 33 and 34 are connected to the gates of the drive transistors 38 and 39 at node points P and Q.

The voltage Vcc, equal to 5 V, is applied to the load transistors 40 and 41 provided at the terminal points of the bit lines BL1 and BL2.

Figure 4:
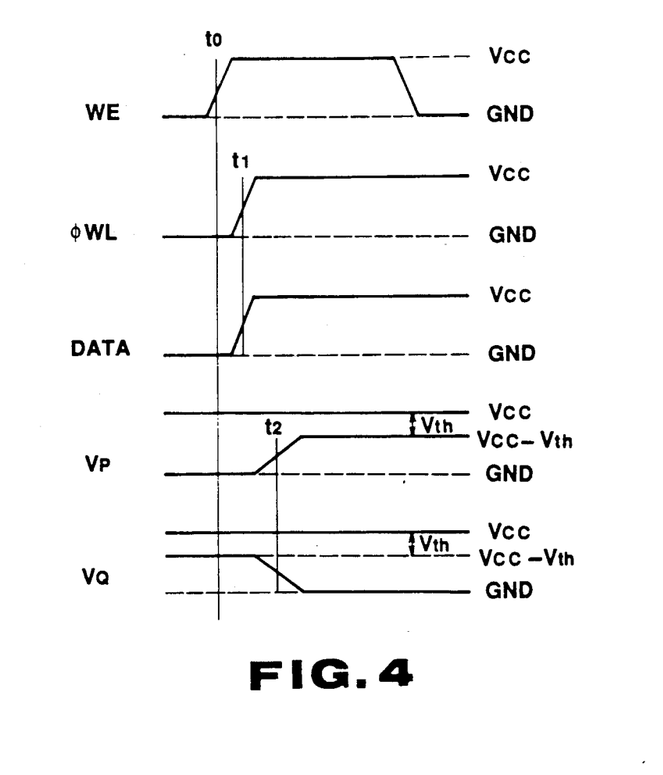
FIG. 4 is a waveform diagram for illustrating the operation of the conventional static RAM shown in FIG. 3.

The above described static RAM operates in the following manner. As shown in FIG. 4, a write enable signal WE rises from ground, GND, to Vcc at time $t_0$. At a slightly later time, $t_1$, a signal $\phi$ on the word line WL rises from ground GND to Vcc. Also at time $t_1$, a data signal DATA rises from ground GND to Vcc. As a result, the word transistor 34 is turned on and a potential voltage Vp at point P is changed from ground GND to a voltage Vp=Vcc−Vth, where Vth is a threshold voltage that is characteristic to the word transistor 34. Conversely, the other word transistor 33 is turned off, with a potential voltage $V_Q$ at point Q being changed from $V_Q$=Vcc−Vth to GND. The threshold voltage Vth which is characteristic of the word transistors is the threshold voltage for zero substrate bias voltage $Vth_O$ plus an increment of Vth due to a body effect ΔVth.

In the above described conventional circuit, when the potential on the word line WL is 5 V (=Vcc) and the threshold voltage for the zero substrate bias voltage $Vth_O$ is approximately 0.8 V, the increment of Vth due to body effect ΔVth is about 1.0 V. Hence, the threshold voltage Vth for word transistor 33 becomes about 1.8 V. Therefore, the voltage Vp as derived from the equation Vp=Vcc−Vth, is about 3.2 V at point p.

The operating margin for the memory cell is expressed as Vp−$Vth_O$. Substituting the above typical value, Vp−$Vth_O$=3.2 V−0.8 V=2.4 V. Such voltage level does not present a problem with regard to the operating margin of the memory cell.

However, with the tendency towards size reduction of the memory cell, it is becoming more and more difficult to produce a sufficient withstand voltage. This is due, for example, to the thickness reduction of the gate oxide film. As a result, it has become extremely difficult to employ the source voltage, Vcc =5 V, and maintain the reliability of the memory cell. As a result, one is obliged to use the internal low voltage for the memory cell. An internal low voltage, $V_{INT}$, of 3 V to 4 V is proposed. Because the threshold voltage for zero substrate bias voltage $Vth_O$ remains substantially constant, the voltage Vp at point P in the memory cell is given by Vp equals $V_{INT}$−Vth, such that Vp=about 1.5 to 2.5 V. Thus, the operating margin Vp−$Vth_O$ is about 0.7 to 1.7 V which is significantly lower than the case in which a source voltage of 5 V is applied.

In view of the above, it is an object of the present invention to provide a static RAM employing a word line drive circuit, wherein the operating margin during writing may be improved without increasing the memory cell size.

The internal low voltage is explained in more detail below.

The external source voltage typically is set at 5 V as a variety of devices are designed to operate at such a source voltage. Therefore, for operating the static RAM at a low voltage, it is necessary to provide an internal low-voltage transformation circuit for producing a voltage level lower than the source voltage.

Figure 8:
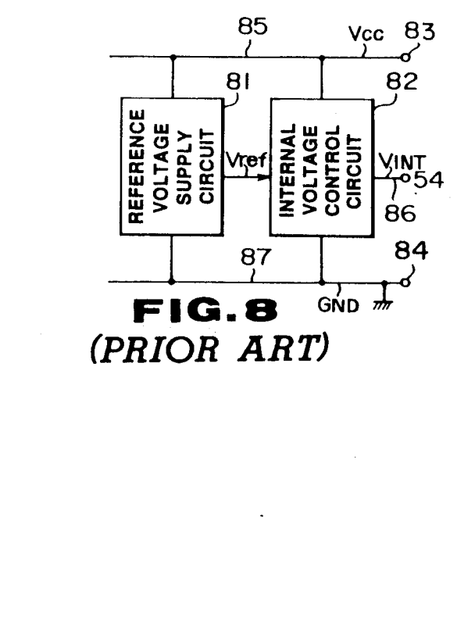
FIG. 8 is a block diagram of a conventional internal voltage supply circuit.

A prior art internal low-voltage transformation circuit is described below with reference to FIG. 8 in which the numeral 81 denotes a reference voltage supply circuit and the numeral 82 denotes an internal voltage control circuit. These circuits 81 and 82 are provided between a power source line 85 and a ground line 87. A power source terminal 83 is derived from the power source line 85. The power source voltage, Vcc equal 5 V, is supplied to the power source terminal 83 and thus, to the reference voltage supply circuit 81. At the reference voltage supply circuit 81, a reference voltage $V_{ref}$ is formed from the power source voltage Vcc. This reference voltage $V_{ref}$ is supplied to the internal voltage control circuit 82. Within the internal voltage control circuit 82, the power source voltage Vcc is controlled on the basis of this reference voltage $V_{ref}$ to form an internal low voltage $V_{INT}$ of, for example, 3 to 4 V. This internal low voltage $V_{INT}$ then is outputted via internal power source line 86 and output terminal 54. A ground terminal for the output terminal low voltage is supplied at terminal 84. The static RAM then is driven by the internal low voltage $V_{INT}$.

When the reference voltage supply circuit 81 and the internal voltage control circuit 82 are provided as described and when the internal voltage control circuit 82 is controlled by the reference voltage $V_{ref}$ received from the reference voltage supply circuit 81 for forming the internal low voltage $V_{INT}$, the reference voltage supply circuit 81 and the internal voltage control circuit 82 are always in an active state. This presents a problem in that the power consumption is increased. Although it may be contemplated to change the load of the circuit 82 occasionally to achieve a savings in power consumption, the circuits 81 and 82 basically are in the active state at all times, thereby limiting the possibility for any reduction in power consumption.

It is therefore another object of the present invention to provide an internal low voltage transformation circuit wherein power consumption may be reduced.

SUMMARY OF THE INVENTION

The present invention provides a static RAM having a word line drive circuit for driving a word-line use for selecting memory cells, wherein the word line drive circuit is designed to apply a high voltage to the word line at the write time and a low voltage to the word line at the read-out time to enable the operating margin to be increased without increasing the memory cell size.

The present invention also provides an internal low-voltage transformation circuit in which a voltage pulled down from the source voltage is from by a reference voltage supply circuit and an internal voltage circuit to derive a low voltage which is supplied to the static memory, wherein the reference voltage supply circuit and the internal voltage control circuit are set to an off state during a standby or a power sown mode of the static memory, and wherein a data hold voltage is obtained by voltage pull-down means the power consumption of such circuit being lower than that of a circuit consisting of the reference voltage supply circuit and the internal voltage control circuit, whereby the power consumption may be reduced when the static memory is operated at a lower voltage.

DESCRIPTION OF PREFERRED EMBODIMENTS

In view of the first above-mentioned object of the invention, the present invention provides a static RAM having a word line drive circuit for applying a high voltage to the word line during the write time and for applying a low voltage to the word line during the read-out time.

The low voltage is a voltage lower than the high voltage which, when applied to the gate of the word transistor, provides for a sufficient read-out with the transconductance gm of the word transistor and which does not change the ratio $\beta R$ of the read-out operation. The high voltage is a voltage higher than the low voltage by, for example, the threshold voltage Vth of the word transistor.

The static RAM may be with, for example, an internal voltage pull-down means. In such case the aforementioned high voltage may be set at an external source voltage Vcc, while the aforementioned low voltage level may be set to the internal low voltage $V_{INT}$.

It is assumed, in a static RAM in which the bit line high level ("H" level) is set equal to the internal low voltage $V_{INT}$, that the high voltage is established during the write time using the word line drive circuit to supply the power source voltage Vcc to the gate of the word transistor. With the potential voltage Vp on the source of the word transistor, Vp equals $V_{INT}$ for Vcc - $V_{INT} \geq$ Vth and Vp equals Vcc minus Vth for Vcc - $V_{INT} <$ Vth.

Hence, the source side potential Vp of the word transistor can be pulled up as compared with the conventional system to obtain the operating margin.

In general, data or storage hold properties of a memory cell are determined by $\beta R$ which is given by $$\beta_R = \frac{gm(\text{drive transistor})}{gm(\text{word transistor})}$$

Figure 1:
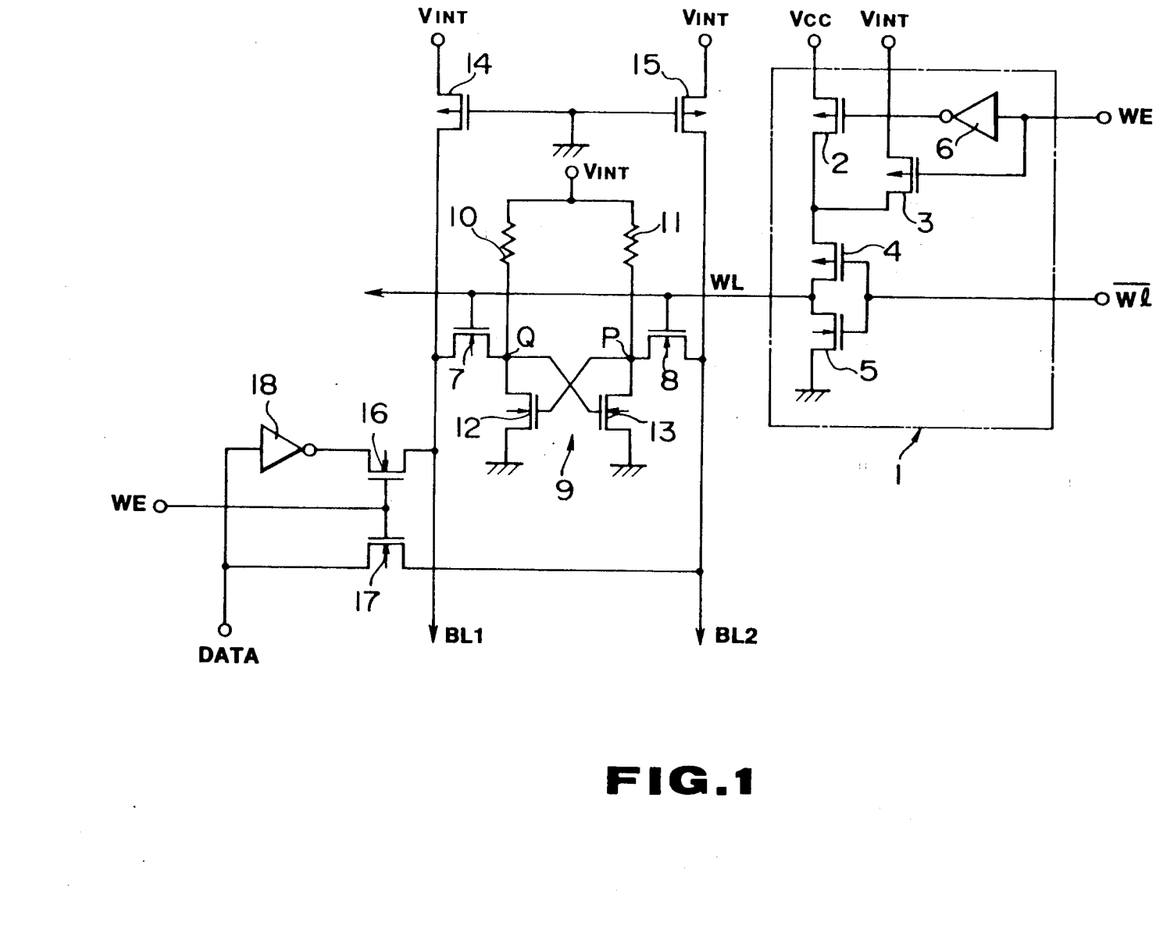
FIG. 1 is a circuit diagram showing a static RAM according to an embodiment of the present invention.

By applying the low voltage, that is, an internal low voltage $V_{INT}$ from the word line drive circuit during the read-out time, the above ratio $\beta R$ of the overall memory cell may be maintained constant to allow for size reduction of the memory cell. In other words, a relatively smaller memory cell may be employed directly as compared with the case in which read-out is performed with gm of the word line and with the channel width increased to provide for follow-up of the drive transistor. FIG. 1 shows, circuitry for a static RAM according to an embodiment of the present invention. The static RAM includes a word line drive circuit 1, a pair of bit lines BL1 and BL2 having terminal load transistors 14 and 15 and a memory cell 9 having word transistors 7 and 8 connected to the bit lines BL1 and BL2.

The memory cell 9 has resistor elements 10 and 11 and drive transistors 12 and 13, in addition to the word transistors 7 and 8. One end of each of the resistor elements 10 and 11 is supplied with an internal low voltage $V_{INT}$ of, for example, 3 to 4 V. The other ends thereof are connected to drain electrodes of the drive transistors 12 and 13. The source electrodes of the drive transistors 12 and 13 are grounded in common, while the gate electrodes thereof are connected at points P and Q with source and gate electrodes of the word transistors 7 and 8. The gate electrodes of the word transistors 7 and 8 are connected to the word line WL and selected from the word line drive circuit 1.

The load transistors 14 and 15 provided at the terminal points of the bit lines BL1 and BL2 have the gate electrodes grounded in common and have the source electrodes supplied with the internal low voltage $V_{INT}$. Data write transistors 16 and 17 connected to the bit lines BL1 and BL2 are controlled by write enable signal WE. Data signals DATA are supplied via data write transistor 17 to a bit line BL2, while being supplied via inverter circuit 18 to the data write transistor 16.

The word line drive circuit 1 is comprised of three pMOS transistors 2, 3 and 4, an nMOS transistor 5 and an inverter circuit 6. The pMOS transistor 2 has its source supplied with the high voltage, (i.e. the source voltage Vcc of, for example, 5 V) and has its gate supplied with the write enable signal WE vis inverter circuit 6. The pMOS transistor 3 has its source supplied with the low voltage, (i.e. the internal low voltage $V_{INT}$) and has its gate supplied directly with the write enable signal WE. Each of the pMOS transistors 2 and 3 has its drain connected to the source of the pMOS transistor 4. The pMOS transistor 4 and the nMOS transistor 5 make up an inverter circuit. A signal $\overline{wl}$ is supplied to the gates of the transistors 4 and 5. The drain electrodes of the pMOS transistor 4 and nMOS transistor 5 are connected in common to the word line WL.

Figure 2:
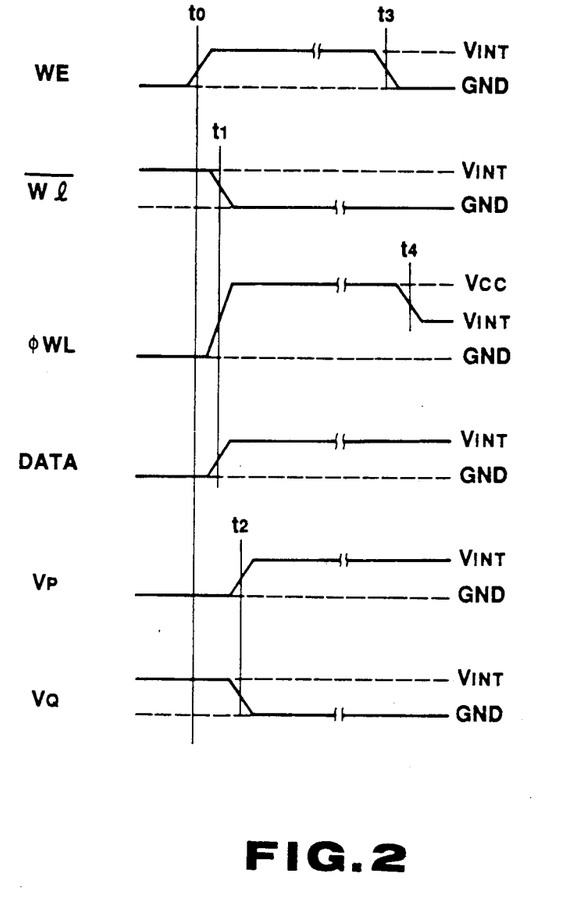
FIG. 2 is a waveform diagram for illustrating the operation of the static RAM shown in FIG. 1.

The above described static RAM of the present embodiment operates as follows:

It is assumed that, initially, the potential of the write enable signal WE is at the GND level, the potential of the signal $\overline{wl}$ is at the $V_{INT}$ level, and the potential of the signal $\phi wl$ of the word line WL and that of the data signal DATA are at GND level, as shown in FIG. 2. It is also assumed that the data of the preceding cycle still remain and the potential Vp at point P in the memory cell is at GND level, while the potential $V_Q$ at point Q is at $V_{INT}$ level.

When a write is executed subsequently, the potential of the write enable signal WE rises from GND to $V_{INT}$ and, with a certain time delay, the potential of the signal $\overline{wl}$ falls from $V_{INT}$ to GND at time $t_1$. In the word line drive circuit 1, the pMOS transistor 2 is turned on. The pMOS transistor 3 is turned off and the pMOS transistor 4 is turned on. The potential of the signal $\phi WL$ on the word line WL rises from GND to the Vcc level.

Assuming that the data are input at this time and that the data signal DATA rises at time $t_1$ to the $V_{INT}$ level, the bit line BL1 is at GND level, while the bit line BL2 is at $V_{INT}$ level. Then, at time $t_2$, the gate and the drain of the word transistor 8 are at the Vcc level and the $V_{INT}$ level, respectively. Assuming that the threshold voltage Vth of the word transistor 8 is given by $Vth = Vth_O + \Delta Vth$, the potential Vp at point P is given by $Vp = V_{INT}$ for $Vcc - V_{INT} \geq Vth$, and by $Vp = Vcc - Vth$ for $Vcc - V_{INT} < Vth$.

Hence, by pulling up the gate potential of the word transistor to Vcc during writing, the potential at point P can be raised to procure the operating margin of the static RAM. At the word transistor 7, the potential at point Q falls from $V_{INT}$ to GND.

During read-out time, the write enable signal WE falls from $V_{INT}$ to GND at time $t_3$. At this time, the pMOS transistors 2 and 3 in the word line drive circuit 1 are turned off and turned on, respectively, with the voltage $\phi WL$ on the word line WL falling at time $t_4$ to the $V_{INT}$ level which is at the low voltage during read-out. In this manner, by supplying $V_{INT}$ from the word line drive circuit 1, the balanced state of gm for the overall memory cell, (i.e. the constant ratio $\beta_R$, which is the ratio of gm of the driven transistor to gm of the word transistor,) is maintained, such that the reduction in size of the circuit elements may be achieved without unnecessarily increasing, for example, the channel width of the circuit elements.

As for the unselected word line WL, the nMOS transistor 5 is turned on and set to the GND level.

Figure 5:
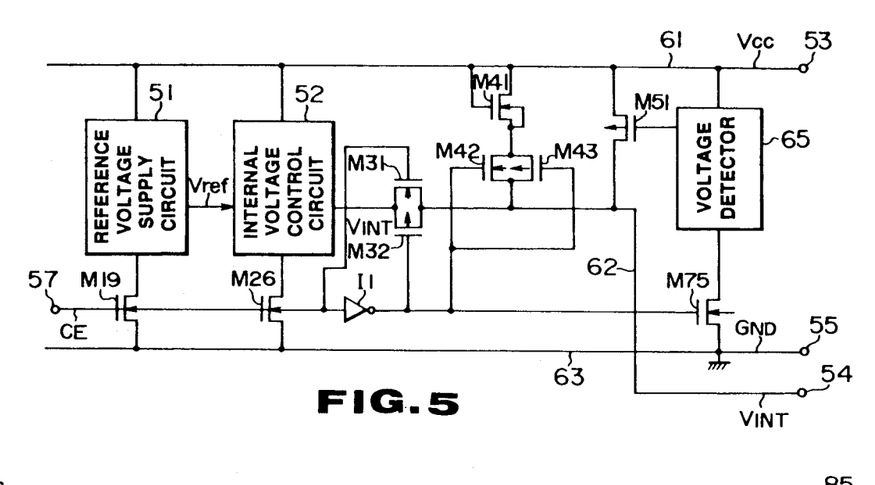
FIG. 5 is a block diagram showing an example of the present invention.

In view of the second object of the invention, the present invention also provides an internal low-voltage transformation circuit in which a source voltage Vcc is pulled down by (1) a reference voltage supply circuit 51 and (2) an internal voltage control circuit 52 to form (3) an internal low voltage $V_{INT}$ which is supplied to a static memory (FIG. 5). During the standby or powered down mode, the reference voltage supply circuit 51 and the internal voltage control circuit 52 are set to an off state. A data hold voltage is produced using power pull down transistor M41 which has a power consumption lower than that of a circuit consisting of the reference voltage supply circuit 51 and the internal voltage control circuit 52 (see FIG. 5).

The internal low voltage $V_{INT}$ of, for example, 3 to 4 V, pulled down from the power source voltage of, for example, 5 V, may be obtained from the reference voltage supply circuit 51 and the internal voltage control circuit 52. When the static RAM is in the active state, the internal low voltage $V_{INT}$ produced as described above is supplied to the static RAM. When the static RAM is in the stand-by state, the operation of the reference voltage supply circuit 51 and the internal voltage control circuit 52 is terminated and the data hold voltage is maintained by MOS transistor M41. In this manner, the operation of the reference voltage supply circuit 51 and the internal voltage control circuit 52 is terminated for realizing saving in power consumption during the standby mode.

The basic arrangement of the present invention is shown in FIG. 5, in which the numerals 51 and 52 denote the reference voltage supply circuit and the internal voltage control circuit, respectively. These circuits 51 and 52 are provided between a power source line 61 and a ground line 63. The operation of the reference voltage supply circuit 51 and that of the internal voltage control circuit 52 are controlled by MOS transistors M19 and M26, respectively. A power source terminal 53 and a ground terminal 55 are derived from the power source line 61 and the ground line 63, respectively.

The internal low voltage $V_{INT}$, pulled down from the power source voltage Vcc, is produced from the reference voltage supply circuit 51 and the internal voltage control circuit 52. The internal low voltage $V_{INT}$ formed in this internal voltage control circuit 52 is output at output terminal 54 via a transmission gate formed by the MOS transistors M31 and M32 and an internal power source line 62.

According to an embodiment of the present invention, the reference voltage supply circuit 51 and the internal voltage control circuit 52 are in operation only when the static RAM is in the active mode, and are out of operation when the static RAM is in the standby mode. This allows the power consumption to be reduced. A chip enable signal CE, for example, may be used for detecting whether the static RAM is in the operating mode or in the standby mode.

A terminal 57 is an input terminal for the chip enable signal CE. The static RAM is in the operating mode or in the standby mode when for example the chip enable signal is "H" or "L", respectively.

This chip enable signal CE is supplied to a transmission gate including MOS transistors M19, M26, M31 and M32.

When the chip enable signal CE is "H", so that the static RAM is in the operating state, the transmission gate comprising the MOS transistors M19, M26, M31 and M32 is turned on. Thus the reference voltage supply circuit 51 and the internal voltage control circuit 52 are in operation causing the reference voltage $V_{ref}$ to be formed in the reference voltage supply circuit 51 from the source voltage Vcc. The reference voltage supplied to $V_{ref}$ is the internal voltage control circuit 52 where the source voltage Vcc is controlled based on the reference voltage $V_{ref}$. In this manner, the internal low voltage $V_{INT}$ is formed. The internal low voltage $V_{INT}$ is output at output terminal 54 via a transmission gate comprising MOS transistors M31 and M32 the internal power source line 62.

When the chip enable signal CE is "L", so that static RAM is in the standby state, the transmission gate comprising MOS transistors M19, M26, M31, and M32 is turned off. Thus the operation of the reference voltage supply circuit 51 and that of the internal voltage control circuit 52 are discontinued. At this time, since the internal low voltage $V_{INT}$ is not output from the internal voltage control circuit 52, it is necessary to supply the data hold voltage to the memory cell. A voltage pull-down circuit including MOS transistor M41 is provided for maintaining the data hold voltage. In this manner, the data hold voltage may be positively provided even when the operation of the circuits 51 and 52 is discontinued.

In order that a predetermined level data hold voltage may be procured when the power source voltage is lowered, a voltage detection circuit 65 is provided between the power source line 61 and the ground line 63 for sensing the level of the power source voltage Vcc. The MOS transistor M51 is controlled as a function of the sensed voltage level to compensate for lowering of the power source voltage Vcc. The voltage detection circuit 65 is controlled by the MOS transistor M75 so as to be in operation only during the standby mode when the chip enable signal CE is "L".

Figure 6:
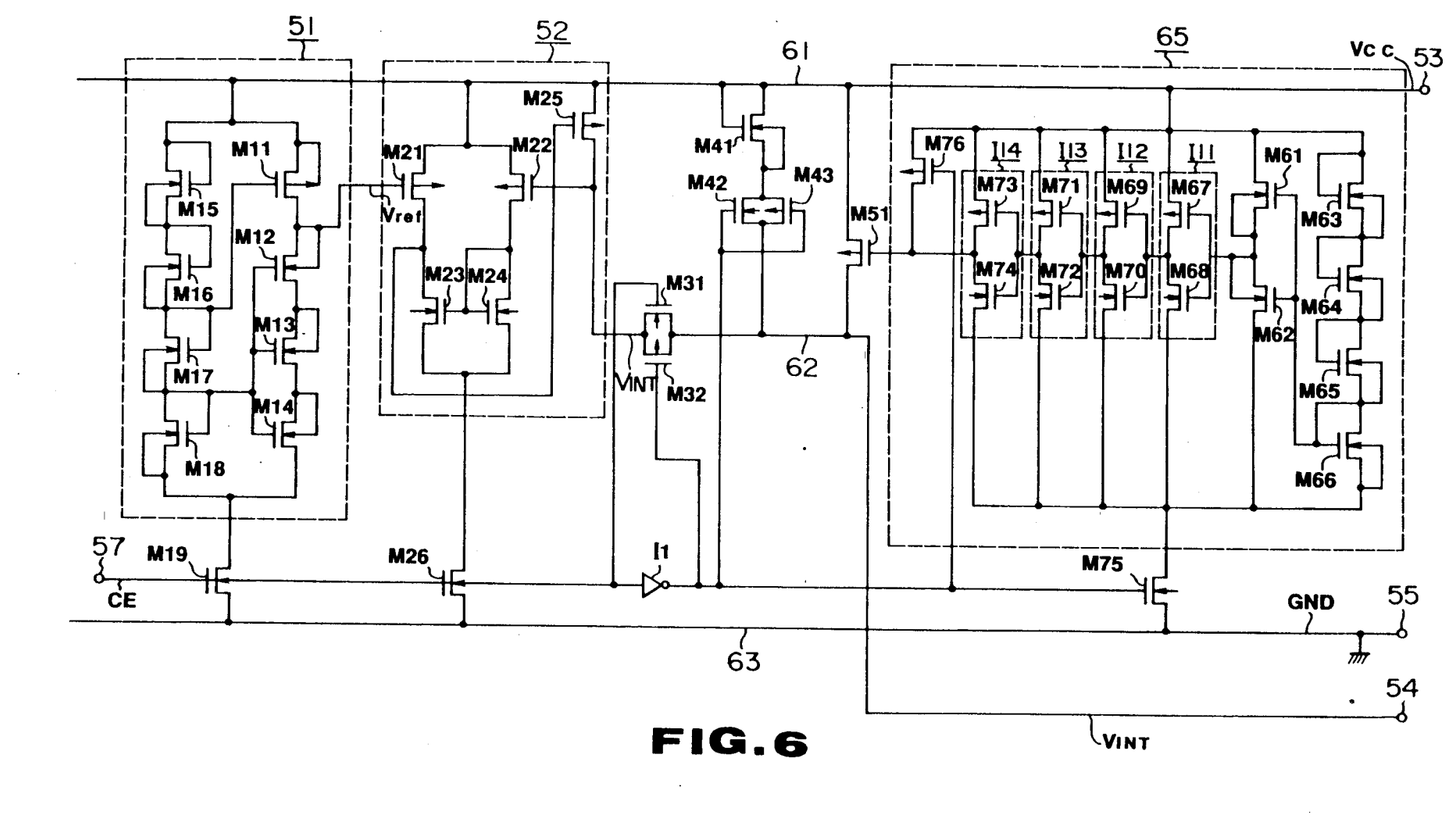
FIG. 6 is a connection diagram showing the detailed structure of the static RAM according to an embodiment of the present invention.

FIG. 6 shows a detailed structure of a preferred embodiment of the present invention. As illustrated, the reference voltage supply circuit 51, forming the reference voltage $V_{ref}$ from the power source voltage Vcc, is made up of a P channel MOS transistor M11 and seven N channel MOS transistors M12 to M18. The P channel MOS transistor M11 has its well and source connected together, while each of the N channel MOS transistors M12, M13 and M14 has its well and drain connected together. The voltage supply circuit 51 is connected between the power source line 61 and the drain of an N channel MOS transistor M19 which is for controlling the operation of the reference voltage supply circuit 51. Within the reference voltage supply circuit 51 series connection is provided consisting of the P channel MOS transistor M11 and the N channel MOS transistors M12 to M14. An output terminal for the reference voltage $V_{ref}$ is provided at a junction between the P channel MOS transistor M11 and the N channel MOS transistor M12. The N channel MOS transistor M19 has its source connected to ground line 63 and its gate connected to input terminal 57 of the chip enable signal CE.

Each of the N channel MOS transistors M15 to M18 has its well and source connected together, and its gate and drain connected together. Between the power source line 61 and the drain of the N channel MOS transistor M19, there also is provided a second series connection consisting of the N channel MOS transistors M15 to M18.

The junction between the N channel MOS transistor M16 and the N channel MOS transistor M17 is connected to the gate of the P channel MOS transistor M11. In like manner, the junction between the N channel MOS transistor M17 and the N channel MOS transistor M18 is connected to the gates of the N channel MOS transistors M12 to M14.

The operation of the reference voltage supply circuit 51 is controlled by the chip enable signal CE received via terminal 57. When the chip enable signal CE has a high level, "H", the N channel MOS transistor M19 is turned on so that the reference voltage supply circuit 51 becomes active. When the chip enable signal CE has a low level "L", the N channel MOS transistor M19 is turned off to disable the operation of the reference voltage supply circuit 51.

Figure 7:
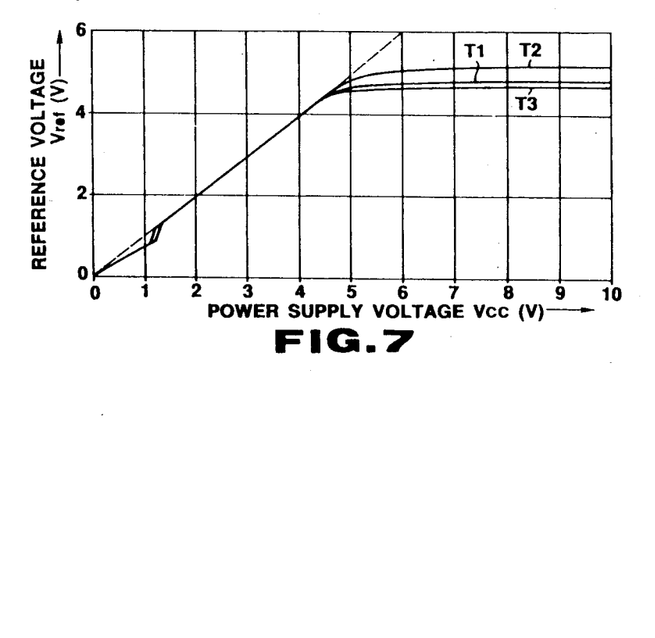
FIG. 7 is a chart for illustrating the voltage relation of an embodiment of the present invention.

FIG. 7 shown characteristic changes of the reference voltage $V_{ref}$ at the junction between the transistor M11 and the transistor M12 with respect to the source voltage Vcc when the reference voltage supply circuit 51 is in the active state. Because the P channel MOS transistor M11 and the three N channel MOS transistors M12 to M14 are connected in series with one another, diodes are formed by the interconnections of the well regions and the source diffusion regions. As the source voltage Vcc is increased gradually, the reference voltage $V_{ref}$ is increased gradually until becoming constant at approximately 3 $V_F$, where $V_F$ denotes the diode threshold voltage. As a result, a constant reference voltage $V_{ref}$ may be produced at the reference voltage supply circuit 51 despite fluctuations in the source voltage. Referring to FIG. 7, curves $T_1$, $T_2$ and $T_3$ show the voltage characteristics at 25° C., 125° C. and −10° C., respectively. It is seen from the characteristics shown in FIG. 7 that the characteristics are not changed markedly with changes in the temperature conditions.

Referring again to FIG. 6, the interval voltage control circuit 52 controls the power source voltage Vcc based on the reference voltage $V_{ref}$ to form the internal low voltage $V_{INT}$. This internal voltage control circuit 52 is made up of P channel MOS transistors M21 and M22, N channel MOS transistors M23 and M24 and a P channel MOS transistor M25.

The P channel MOS transistors M21 and M22 have their sources connected in common at a junction point which is connected to the power source line 61. The P channel MOS transistor M21 has its drain connected to the drain of the N channel MOS transistor M23. The P channel MOS transistor M22 has its drain connected to the drain of the N channel MOS transistor M24. The N channel MOS transistor M23 has its gate connected in common to the gate of the N channel MOS transistor M24, while the N channel MOS transistor M24 has its gate connected in common to its drain, such that a current mirror circuit is formed by the N channel MOS transistors M23 and M24. The N channel MOS transistors M23 and M24 have their sources connected to a drain of the N channel MOS transistor M26 for controlling the operation of the internal voltage control circuit 52. The N channel MOS transistor M26 has its source connected to the ground line 63. The N channel MOS transistor M26 has its gate connected to the input terminal 57 of the chip enable signal CE.

The P channel MOS transistor M21 has its gate connected to a junction between the P channel MOS transistor M11 and the N channel MOS transistor M12 which forms the output terminal of the reference voltage $V_{ref}$. The P channel MOS transistor M25 is provided between the gate of the P channel MOS transistor M22 and the power source line 61. The output terminal of the internal low voltage $V_{INT}$ is led out from the gate of the P channel MOS transistor M22. The P channel MOS transistor M25 has its gate connected to a junction between the drain of the P channel MOS transistor M21 and the drain of the N channel MOS transistor M23.

The operation of the internal voltage control circuit 52 is controlled by the chip enable signal received via terminal 57. When the chip enable signal CE has a high level, "H", the N-channel MOS transistor M26 is turned on, so that the internal voltage control circuit 52 becomes active. When the chip enable signal CE goes low, "L", N channel MOS transistor M26 is turned off, disabling the operation of the internal voltage control circuit 52.

In the internal voltage control circuit 52 shown in FIG. 6, the P channel MOS transistor M21 and the P channel MOS transistor M22 make up a differential circuit. The output from the junction between the P channel MOS transistor M21 and the N channel MOS transistor M23 is fed back via P channel MOS transistor M25 to the P channel MOS transistor M22. Thus the P channel MOS transistor M25 is controlled so that the voltage applied to the gate of the P channel MOS transistor M21 will be equal to the voltage applied to the gate of the P channel MOS transistor M22. Since the reference voltage $V_{ref}$ is applied to the gate of the P channel MOS transistor M21, the gate voltage of the P channel MOS transistor M22 is controlled so as to be equal to the reference voltage $V_{ref}$. Thus, the internal low voltage $V_{INT}$ equal to the reference voltage $V_{ref}$ is produced at the junction between the source of the P channel MOS transistor M25 and the gate of the N channel MOS transistor M22.

The internal low voltage $V_{INT}$ produced is output from output terminal 54 via a transmission gate consisting of the N channel MOS transistor M31 and the P channel MOS transistor M32 and via internal power source line 62. The gate of the N channel MOS transistor M31 is supplied with the chip enable signal CE from terminal 57, while the gate of the P channel MOS transistor M32 is supplied with the chip enable signal CE from terminal 57 after being inverted by an inverter $I_1$. Hence, when the chip enable signal CE is high, "H", the transmission gate consisting of N channel MOS transistor M 31 and the P channel MOS transistors M32 is turned on, so that the internal low voltage $V_{INT}$ formed by the internal voltage control circuit 52 is output from the internal low voltage output terminal 54. When the chip enable signal CE is low, "L", the transmission gate consisting of the N channel MOS transistor M31 and the P channel MOS transistor M32 is turned off.

In this manner, the present embodiment, the internal low voltage $V_{INT}$ is output from output terminal 54 when the chip enable signal CE is high, "H", but is not output when the chip enable signal CE is low, "L".

For maintaining the data storage voltage of the memory cell, an N channel MOS transistor M41 having its drain and gate connected together and its well and source similarly connected together is provided between the power source line 61 and the internal power source line 62, with transmission gate between the transistor 41 and source line 62. The transmission gate includes an N channel MOS transistor M42 and a P channel MOS transistor M43. The gates of the N channel MOS transistor M42 and the P channel MOS transistor M43 are supplied with the inverted chip enable signal CE, inverted by the inverter $I_1$.

The transmission gate consisting of the N channel MOS transistor M42 and P channel MOS transistor M43 is turned on perpetually notwithstanding the chip enable signal CE. When the chip enable signal CE is low, "L", so that the internal low voltage $V_{INT}$ is no longer output at output terminal 54 via internal power source line 62, the data hold voltage from the N channel MOS transistor M41 is applied via internal power source line 62 to the memory cell to maintain the data hold voltage.

The N-channel MOS transistor M41 is selected to be small in size and have a low power consumption. Thus, when the internal low voltage V formed in the internal voltage control circuit 52 is output at the output terminal 54, the voltage pull-down circuit consisting of this N channel MOS transistor M41 can be disregarded. To prevent the data hold voltage from being lowered under the adverse effect of the fluctuations in the power source voltage Vcc, a voltage detection circuit 65 is provided for sensing the fluctuations in the power source voltage Vcc. The P channel MOS transistor M51 is controlled by the output of this voltage detection circuit 65 to compensate for lowering of the data hold voltage.

The voltage detection circuit 65 is made up of N channel MOS transistors M61 and M62 for detecting the level of the power source voltage $V_{CC}$, and N channel MOS transistors M63, M64, M65 and M66 forming the voltage to be supplied to the gates of the N channel MOS transistors M61 and M62. The circuit 65 also includes P channel MOS transistor M67, and N channel MOS transistor M68 forming inverter I11; a P channel MOS transistor M69 and an N channel MOS transistor M70 forming inverter I12; a P channel MOS transistor M71 and an N channel MOS transistor M72 forming inverter I13; and a P channel MOS transistor M73 and an N channel MOS transistor M74, inverter I14.

Each of the N channel MOS transistors M61 and M62 has its well and drain connected together. A series connection of the N channel MOS transistors M61 and M62 is provided between the power source line 61 and the drain of an N channel MOS transistor M75 for controlling the operation of the voltage detection circuit 65.

Each of the N channel MOS transistors M63 and M66 has its well and source connected together, while also having its gate and drain connected together. A series connection of these N channel MOS transistor M63 and M66 is connected between the power source line 61 and the drain of the N channel MOS transistor M75.

The junction between the N channel MOS transistor M65 and the N channel MOS transistor M66 is connected to the gates of the N channel MOS transistors M61 and M62.

With respect to inverter I11, the P channel MOS transistor M67 has its drain connected to the drain of the N channel MOS transistor M68, and its source connected to the power source line 61. The N channel MOS transistor M68 has its source connected to the drain of the N channel MOS transistor M75. The gates of the P channel MOS transistor M67 and M68, acting as the input terminal of the inverter I11, are connected in common to a junction between the N channel MOS transistor M61 and the N channel MOS transistor M62. The junction between the drain of the P channel MOS transistor M67 and the N channel MOS transistor M68, acting at the output terminal of the inverter I11, is connected to the junction between the gate of the P channel MOS transistor M69 and the gate of the N channel MOS transistor M70, which function as the input terminal of the inverter I12.

With respect to inverter I12, the P channel MOS transistor M69 has its drain connected to the drain of the N channel MOS transistor M70 and its source connected to the power source line 61. The N channel MOS transistor M70 has its source connected to the drain of the N channel MOS transistor M75. The junction between the drain of the P channel MOS transistor M69 and the drain of the N channel MOS transistor M70, acting as the output terminal of the inverter I12, is connected to the gate of the P channel MOS transistor M71 and the gate of the N channel MOS transistor M72, which function as the input terminal of the inverter I13.

With respect to the inverter I13, the P channel MOS transistor M71 has its drain connected to the drain of the N channel MOS transistor M72 and its source connected to the power source line 61. The N channel MOS transistor M72 has its source connected to the drain of the N channel MOS transistor M75. The junction between the drain of the P channel MOS transistor M71 and the drain of the N channel MOS transistor M72 is connected to the gate of the P channel MOS transistor M73 and the gate of the N channel MOS transistor M74 which function as the input terminal of the inverter I14.

With respect to the inverter I14, the P channel MOS transistor M73 has its drain connected to the drain of the N channel MOS transistor M74 and its source connected to the power source line 61. The N channel MOS transistor M74 has its source connected to the drain of the N channel MOS transistor M75.

The junction between the N channel MOS transistor M73 and the N channel MOS transistor M74, acting as the output terminal of the inverter I14, is connected to the gate of the P channel MOS transistor M51. The P channel MOS transistor M51 is provided between the power source line 61 and the internal power source line 62. A P channel MOS transistor M76 is provided between the power source line 61 and the junction between the N channel MOS transistor M73 and the N channel MOS transistor M74. This P channel MOS transistor M76 has its gate connected to the output terminal of the inverter I14.

When the chip enable signal CE is high, "H", to render the static RAM operative, the output of the inverter I1 becomes low, "L", so that the N channel MOS transistor M75 is turned off and the P channel MOS transistor M76 is turned on. Thus the operation of the voltage detection circuit 15 ceases, while the P channel MOS transistor M76 is turned on, so that the P channel MOS transistor M51 is turned off.

When the chip enable signal CE is low, "L", to produce the standby state of the static RAM, the output of the inverter I1 becomes high, "H", so that the N channel MOS transistor M75 is turned on the P channel MOS transistor M76 is turned off, causing the voltage detection circuit 65 to come in operation.

With the voltage detection circuit 65 in operation, the voltage at the junction between the P channel MOS transistor M61 and the N channel MOS transistor M62 is changed with changes in the source voltage Vcc, such that the level of the source voltage Vcc is detected at the junction between the P channel MOS transistor M61 and the N channel MOS transistor M62. The thus sensed voltage level is supplied to the gate of the P channel MOS transistor M51 via inverters $I_{11}$ to $I_{14}$. This enables compensation for the data hold voltage in case of adverse lowering of the source voltage Vcc.

When the source voltage Vcc is not less than a predetermined value, the voltage detected at the junction between the P channel MOS transistor M61 and the N channel MOS transistor M62 also is not less than such a predetermined value, so that the output of the inverter I11 is low, "L", the output of the inverter I12 is high, "H", the output of the inverter I13 is low, "L", and the output of the inverter I14 is high, "H". Thus the P channel MOS transistor M51 is turned off.

When the source voltage Vcc is not more than the predetermined value, the voltage detected at the junction between the P channel MOS transistor M61 and the N channel MOS transistor M62 also is not more than the predetermined value, the causing the output from the inverter I11 to be high, "H", the output from the inverter I12 to be low, "L", the output from the inverter $I_{13}$ to be high "H", and the output from the inverter I14 to be low, "L". Thus the P channel MOS transistor M51 is turned on. With the P channel MOS transistor M51 being turned on, the power source line 61 and the internal power source line 62 are connected to each other and the voltage output from the internal low voltage output terminal 54 is pulled up.

It will be seen from the foregoing that, in the static RAM of the present invention, the potential at the source side or the driver transistor side of the word transistor is increased to improve the operating margin of the memory cell due to the high voltage supplied to the word line during writing by the word line drive circuit. During read-out, the low voltage is applied from the word line drive circuit to the word line to allow for effective data storage while the cell size remains to be of the minimum size.

Secondly, according to the present invention, while the static RAM is in the active state, the internal low voltage $V_{INT}$ is supplied, the voltage $V_{INT}$ being produced when the reference voltage supply circuit 51 and the internal voltage control circuit 52 are operative. When the static RAM is in the standby mode, the operation of the reference voltage supply circuit 51 and the internal voltage control circuit 52 is discontinued and the data hold voltage is maintained by the MOS transistor M41 to achieve saving in power consumption.

What is claimed is:

1. A static random access memory comprising:
a plurality of memory cells, each memory cell having an operating mode and a standby mode and including a flipflop circuit and a pair of word transistors, each word transistor having a gate electrode,
a pair of bit lines in which each bit line is connected to a respective word transistor of each of the pairs of word transistors,
a word line connected to said gate electrode of each of said pairs of word transistors, and
internal low voltage supply means including a reference voltage supply circuit and an internal voltage control circuit for supplying an internal low voltage pulled down from a power source voltage to said plurality of memory cells in said operating mode,
said internal low voltage supply means setting said reference voltage supply circuit and said internal voltage control circuit to an off state in said standby mode, said internal low voltage supply means further including voltage pull-down means for supplying a data hold voltage to said plurality of memory cells in said standby mode and having a power consumption lower than that of a circuit including said reference voltage supply circuit and said internal voltage control circuit in an on state.

2. A static random access memory according to claim 1 wherein said voltage pull-down means is a constant voltage circuit including MOS transistors.

3. A static random access memory according to claim 1 further including means by which said reference voltage supply circuit and said internal voltage control circuit are turned off in response to a predetermined state of a chip enable signal.

4. A static random access memory according to claim 1, further comprising a voltage detection circuit operative in said standby mode for sensing fluctuations in the power source voltage, and means for compensating for a lowering of the power source voltage based on a sensing of said fluctuations so as to maintain said data hold voltage.

* * * * *